(12) United States Patent
Cok et al.

(10) Patent No.: US 8,183,765 B2
(45) Date of Patent: May 22, 2012

(54) CONTROLLING AN ELECTRONIC DEVICE USING CHIPLETS

(75) Inventors: Ronald S. Cok, Rochester, NY (US); John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 166 days.

(21) Appl. No.: 12/546,118

(22) Filed: Aug. 24, 2009

(65) Prior Publication Data

US 2011/0043105 A1 Feb. 24, 2011

(51) Int. Cl.
*H01J 1/62* (2006.01)
*H01J 63/04* (2006.01)

(52) U.S. Cl. ........ 313/505; 313/483; 313/500; 313/501; 313/502; 313/503; 313/504; 313/506

(58) Field of Classification Search .................. None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | Vanslyke et al. | |
| 5,340,978 A | 8/1994 | Rostoker et al. | 250/208.1 |
| 6,384,529 B2 | 5/2002 | Tang et al. | |
| 6,606,079 B1 | 8/2003 | Smith | 345/92 |
| 6,919,681 B2 | 7/2005 | Cok et al. | |
| 6,987,355 B2 | 1/2006 | Cok | |
| 7,169,652 B2 * | 1/2007 | Kimura | 438/149 |
| 7,230,594 B2 | 6/2007 | Miller et al. | |
| 7,492,377 B2 | 2/2009 | Edwards et al. | 345/694 |
| 2002/0078559 A1 * | 6/2002 | Buchwalter et al. | 29/832 |
| 2003/0223138 A1 | 12/2003 | Akiyama | |
| 2006/0055864 A1 | 3/2006 | Matsumura et al. | |
| 2007/0057263 A1 | 3/2007 | Kahen | |

FOREIGN PATENT DOCUMENTS

| | | |
|---|---|---|
| EP | 1403691 A1 | 3/2004 |
| EP | 1437703 A1 | 7/2004 |

OTHER PUBLICATIONS

The Electronic Packaging Handbook, copyright 2000, Ed. Blackwell, ISBN-10 0849385919, published in collaboration by CRC Press and IEEE Press.
International Search Report dated May 3, 2011.
U.S. Office Action dated Oct. 7, 2011 (U.S. Appl. No. 12/272,043).

* cited by examiner

*Primary Examiner* — Natalie Walford
(74) *Attorney, Agent, or Firm* — Morgan, Lewis & Bockius LLP (57) ABSTRACT

An electronic apparatus including a common substrate, a plurality of controlled electronic devices disposed over the common substrate, and a wiring layer having a plurality of conductors formed on the common substrate. A plurality of chiplets are located over the common substrate, each chiplet having an independent substrate separate from the common substrate, each independent substrate having a bottom side opposing a top side with one or more connection pads formed on the bottom side of the chiplet, and each chiplet including circuitry for controlling functions of one or more of the controlled electronic devices. The chiplets are adhered to the common substrate with the bottom side of the chiplet closer to the common substrate than the top side of the chiplet, and each connection pad is electrically connected to one of the plurality of conductors.

6 Claims, 4 Drawing Sheets

CONTROLLING AN ELECTRONIC DEVICE USING CHIPLETS

CROSS REFERENCE TO RELATED APPLICATION

Reference is made to U.S. patent application Ser. No. 12/191,478, filed Aug. 14, 2008, and entitled, "OLED DEVICE WITH EMBEDDED CHIP DRIVING," by Winters et al., the disclosure of which is incorporated herein.

FIELD OF THE INVENTION

The present invention relates to devices employing independent control chiplets having separate substrates distributed over the common substrate.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored, light-emitting elements commonly referred to as sub-pixels, typically emitting red, green, and blue light, to represent each image element. A variety of flat-panel display technologies are known, for example plasma displays, liquid crystal displays, and light-emitting diode displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, charge transport, or charge blocking to the light-emitting-thin-film materials, and are known in the art. The materials are placed upon a substrate between electrodes, with an encapsulating cover layer or plate. Light is emitted from a sub-pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "STACKED OLED DISPLAY HAVING IMPROVED EFFICIENCY" by Cok. It is also known to employ a white sub-pixel that does not include a color filter, for example, as taught in U.S. Pat. No. 6,919,681 entitled, "COLOR OLED DISPLAY WITH IMPROVED POWER EFFICIENCY" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al).

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple, prior-art active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

A wide variety of technologies are employed for integrating computing circuitry. Integrated circuits formed on silicon substrates and packaged in ceramic or plastic packages have been used for many years. Wires extending from the top of the silicon substrate are bonded to pins to provide electrical connectivity to the circuits. Other packaging methods are known, for example flip chips, in which the silicon substrate is bonded to another substrate with electrically-connective solder bumps. Multi-Chip-Modules incorporating multiple silicon substrates in a common package are also used to increase packaging density. These technologies are described, for example, in "The Electronic Packaging Handbook", copyright 2000, Ed. Blackwell, ISBN-10 0849385919, published in collaboration by CRC Press and IEEE Press. Three-dimensional chip stacks are also known, in which bare die are interconnected to form stacks of computing elements.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials.

Photo-voltaic systems that generate electricity also employ silicon films, either crystalline or amorphous, together with transparent and metallic conductors.

Matsumura et al describe crystalline silicon substrates used for driving LCD displays in US Patent Application No. 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown.

It is useful to test devices during manufacture to identify faulty devices as soon as possible. By identifying the faulty devices, the devices can be repaired or rejected without doing further work on the faulty device and thereby wasting manufacturing resources. It is difficult, however, to test pixel-control circuits for displays without actually constructing the displays and observing the light emission from the displays. At that point in the manufacturing process, it can be impossible to correct a circuit defect and the device must be discarded. There is a need, therefore, for an improved manufacturing process for constructing a device that is amenable to repair in the presence of manufacturing faults. Furthermore, there is a need for improved control circuits with higher performance distributed over a substrate.

SUMMARY OF THE INVENTION

In accordance with the invention, an electronic apparatus comprises:

(a) a common substrate having a working area including a plurality of chiplet locations;

(b) a plurality of controlled electronic devices disposed over the common substrate in the working area;

(c) a wiring layer having a plurality of conductors formed on the common substrate;

(d) a plurality of chiplets located over the common substrate in the chiplet locations, each chiplet having an independent substrate separate from the common substrate, each independent substrate having a bottom side opposing a top side with one or more connection pads formed on the bottom side of the chiplet, each chiplet including circuitry for controlling functions of one or more of the controlled electronic devices; and (e) wherein the chiplets are adhered to the common substrate with the bottom side of the chiplet closer to the common substrate than the top side of the chiplet, and each connection pad is electrically connected to one of the plurality of conductors.

ADVANTAGES

The present invention provides an improved control circuit for controlling devices with distributed control elements and a manufacturing process that enables test and repair of such circuits.

DETAILED DESCRIPTION OF THE INVENTION

Figure 1:
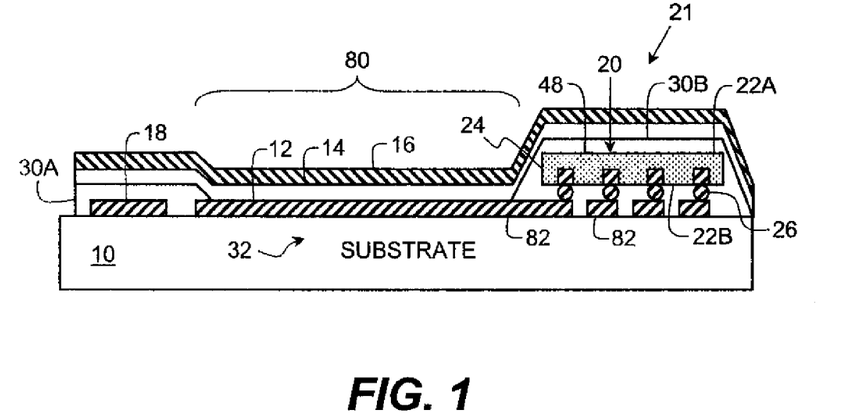
FIG. 1 is a partial cross-section of a chiplet pixel-control circuit and device according to an embodiment of the present invention.
Figure 2:
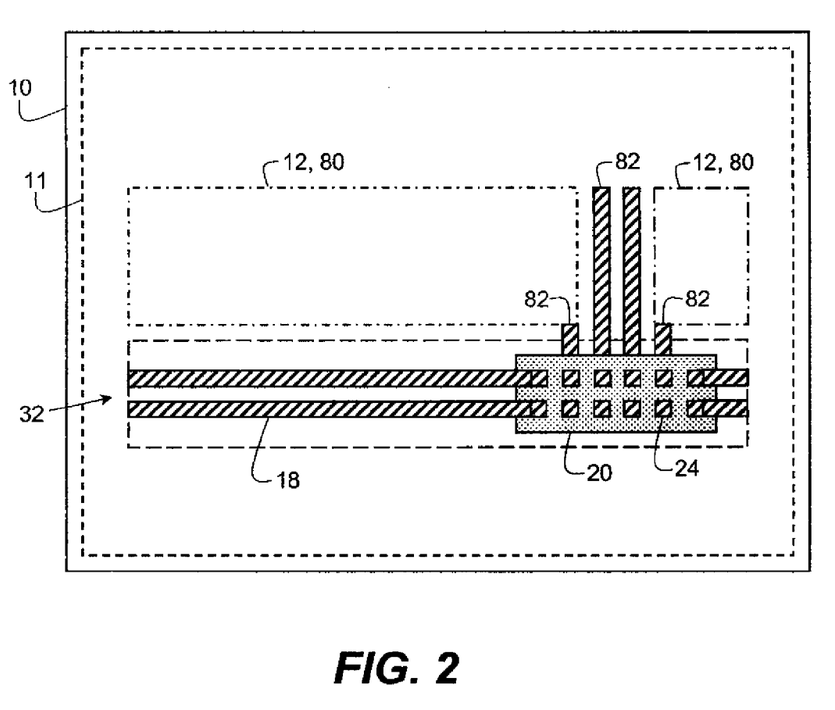
FIG. 2 is a bottom view of a portion of a display device of FIG. 1 according to an embodiment of the present invention.

Referring to FIGS. 1 and 2, in one embodiment of the present invention, an electronic apparatus comprises a common substrate 10 having an optical working area 11 with a plurality of chiplet locations 21 on the common substrate 10 in the working area 11. A plurality of controlled electro-optic devices 80, each electro-optic device adapted to emit or absorb light, are disposed over the common substrate 10 in the working area 11, a wiring layer 32 having a plurality of conductors 18 is formed on the common substrate 10. The conductors can comprise, for example, metal, conductive metal oxides, or conductive polymers). A plurality of chiplets 20 are located over the common substrate 10 in the chiplet locations 21, each chiplet 20 having an independent substrate 48 separate from the common substrate 10, each independent substrate 48 having a top side 22A opposing a bottom side 22B with one or more connection pads 24 formed on the bottom side 22B of the chiplet 20. Each chiplet 20 includes circuitry for controlling functions of one or more of the controlled electro-optic devices 80. The chiplets 20 are adhered to the common substrate 10 with the bottom side 22B of the chiplet 20 closer to the common substrate 10 than the top side 22A of the chiplet. The connection pads 24 are electrically connected to one of the plurality of conductors 18. The conductors 18 can form an electrical buss for communicating control, power, or ground signals to the chiplet 20. Referring to FIG. 2, in a bottom view, the device can be a display, the working area 11 of the common substrate 10 can be a display area, and the controlled electro-optic devices 80 can be light-emitting pixels 80. The conductors 18 and chiplets 20 are located in the working display area 11. The conductors 18 can electrically connect connection pads 24 in chiplets 20 to the controlled electro-optic devices 80, to connection pads 24 on other chiplets 20, or to external electronic devices (not shown). Referring to the cross-section shown in FIG. 3, in a further embodiment of the present invention, connection pads 24 can also be formed on the top side 22A of one or more chiplets 20, as well as on the bottom side 22B of one or more chiplets 20.

As used herein, a working area of a substrate is the area of the substrate in which the function of the electro-optic apparatus is performed. For example, in a display, the working area is the area of the substrate from which light is emitted. In an alternative example, in a photovoltaic system, the working area is the area of the substrate in which light is absorbed and current produced. In yet another example, in an image sensor the working area is the area of the substrate exposed to the image-forming light, that is, the sensing area of the substrate. According to the present invention, for example, the chiplets are located in the working area below, above, or between light-emitting, light-sensing, or light-absorbing electronic devices that are controlled by the chiplets. Therefore, the controlled electro-optic devices can be pixels in a display, sensors in an image sensor, or current generating circuits in a photovoltaic cell. Electro-optic devices that respond to incident light (and hence absorb light) are also included in the present invention. The working area 11 includes space over the substrate 10 that is between optically active areas, for example space between pixels in a display. As intended herein, the working area 11 includes all of the area occupied by the controlled electro-optic devices 80 and any area over the substrate 10 between the controlled electro-optic devices 80. Hence, the chiplets 20 are within the working area 11, even if the chiplets 20 themselves are not optically active.

In one embodiment of the present invention, the device can be a display device, and the chiplets can provide active-matrix or passive-matrix control to pixels. Referring back to FIGS. 1 and 2, a chiplet 20 located over the common substrate 10 can be connected to a first electrode 12 through an electrode connector 82 and electrical connection 26. The first electrode 12 can be coated with a layer 14 of light-emitting materials. A second electrode 16 can be formed over the layer 14 of light-emitting materials. The first and second electrodes 12, 16 can then provide a current, controlled by the chiplet 20, through the light-emitting layer 14, causing it to emit light as a pixel 80. Planarization layers 30A and 30B can be employed to define the light-emitting area of the pixel and to bury the chiplets 20, the conductors 18, electrode connectors 82, the electrical connections 26, and the metal wiring layer 32. Typically, the conductors 18 are made of metal using conventional photolithographic processes and can form a single metal wiring layer 32. The planarization layers 30A and 30B can be coated and patterned using conventional photolithographic processes. The electrical connections 26 electrically connecting the connection pads 24 to the conductors 18 or electrode connectors 82 can comprise, for example, a curable conductor, a solder, or an anisotropic conductive compressive film material. The curable conductor, solder, or anisotropic conductive compressive film material can be adhesive, thereby adhering the chiplet 20 to the substrate 10. As used herein, a curable conductor includes conductive polymers that can be dried, heated, or exposed to light to change their conductive properties. Curable conductors can also include solder and conductors that respond to pressure or heat. Solder can be cured (for example by heat supplied by a laser or other heating element) to provide a robust electrical contact by melting the solder and allowing it to cool. Curable conductors can also include nanoparticulate inks that sinter with the application of heat. Anisotropically conductive films can be compressed (e.g. by thermal compression bonding) to provide electrical connections 26 between the connection pads 24 and conductors 18 or electrode connectors 82. Curing methods can be locally applied (e.g. with a targeted laser burst). Alternatively, non-curable conductors may be employed, including conductive polymers or anisotropically-electrically-conductive elastomers or films or thermally compressed films. All of these materials are known in the art. Some may be applied as liquids or pastes and coated in a pattern or without a pattern and, if cured, cured with or without a pattern.

Figure 4:
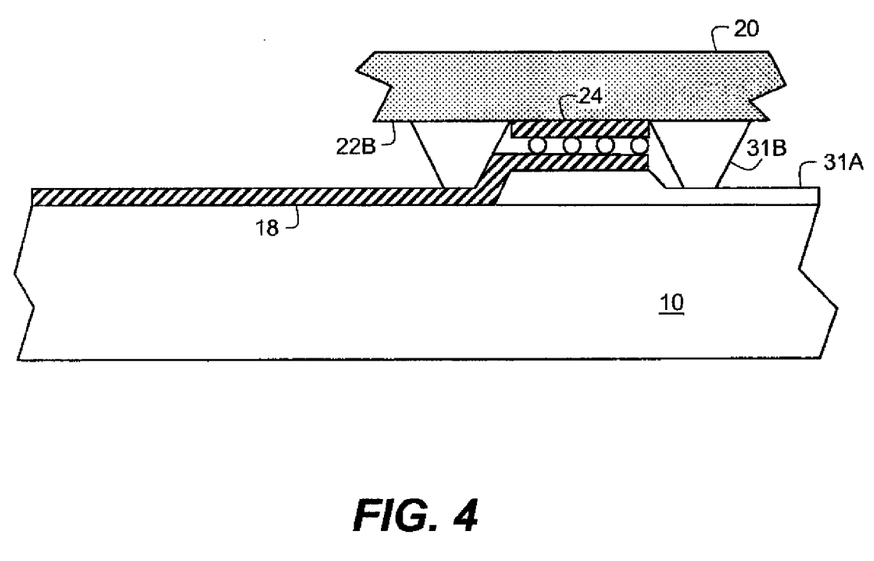
FIG. 4 is a cross-section of a chiplet and substrate having topographical structures according to yet another embodiment of the present invention.

Referring to FIG. 4, in another embodiment of the present invention, the bottom side 22B of a chiplet 20 having connection pads 24 electrically connected to the conductors 18 can have a non-planar surface with structures 31B; complementary structures 31A can be located on the common substrate 10, the complementary structures 31A having a shape complementary to the chiplet shape in the desired chiplet locations. The structures on the common substrate 10 and on the chiplet 20 can be formed using conventional photolithographic processes known in the display and semiconductor art. The complementary structures 31A and 31B on the chiplet 20 and the common substrate 10 serve to physically align the chiplet 20 to the common substrate 10 to provide improved yields and fewer problems with electrical connections between the connection pads 24 and the conductors 18.

As illustrated in FIGS. 1, 2, 5A-5E and 6, a device, for example an electronic apparatus, for example a display device, can be constructed according to a method of the present invention by providing 110 a common substrate 10 having a working area 11 including a plurality of chiplet locations and forming 130 a plurality of conductors 18 in a wiring layer 32 on the common substrate 10. The controlled electro-optic devices 80 can be formed over the common substrate 10. A plurality of chiplets 20 can be provided 120. The chiplets 20 are formed from a silicon wafer with a largely planar chiplet substrate 48 separate and independent from the common substrate 10 and have two largely parallel and opposed planar sides on which connection pads 24 can be formed. The chiplets 20 have a bottom side 30B and an opposed top side 30A with connection pads 24 formed on at least the bottom side 30B. The chiplets 20 can be applied 140 directly to the common substrate 10 by printing with a stamp that employs Vander Waal's forces to adhere the top side 30A of the chiplets 20 to a stamp to release the chiplets 20 from a silicon wafer and then brings the chiplets 20 in contact with the common substrate 10 to apply 140 the chiplets 20 to the common substrate 10. In this case, the connection pads 24 of the chiplets 20 must be formed on a side of the chiplets 20 opposite the original, silicon surface of the wafer that is then the bottom side 30B of the chiplet 20.

Figure 5A:
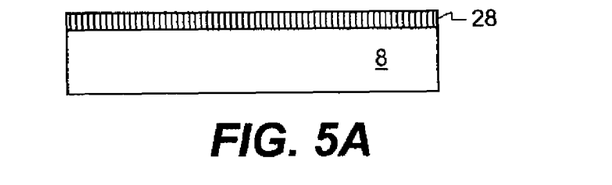
FIGS. 5A-5E are progressive, partial cross-sections of a chiplet and substrate illustrating the intermediate structures in making an embodiment of the present invention according to a method of the present invention.
Figure 5B:
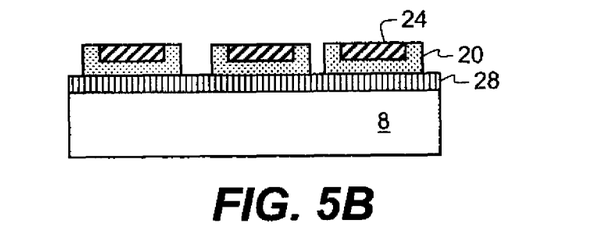
Figure 5C:
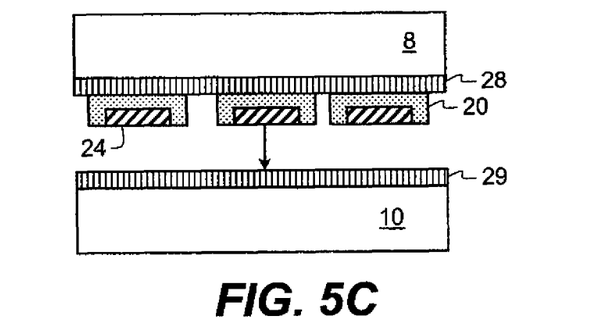
Figure 5D:
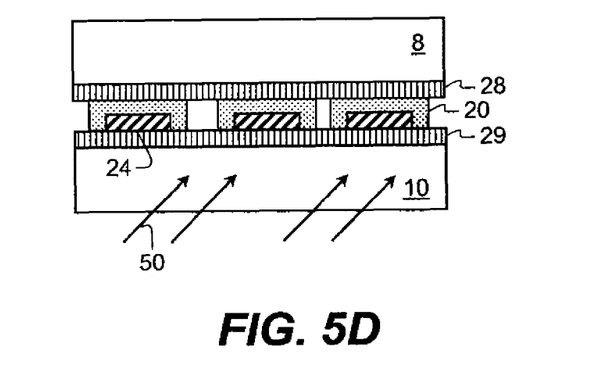

In an alternative embodiment of the present invention (FIGS. 5A-5E), an intermediate substrate 8 can be provided 100 with an adhesive layer 28 formed on an adhesive-receiving side of the intermediate substrate 8 (FIG. 5A). The chiplets 20 can be printed 125 onto the intermediate substrate with a stamp that employs Vander Waal's forces to adhere the top side 30A of the chiplets 20 to a stamp to release the chiplets 20 from a silicon wafer and then brings the chiplets 20 in contact with the intermediate substrate 8 (FIG. 5B). In this case, the connection pads 24 of the chiplets 20 must be formed on a side of the chiplets 20 corresponding to the original, silicon surface of the wafer that is then the bottom side 30B of the chiplet 20. The intermediate substrate 8 is then inverted 135, that is the side of the intermediate substrate 8 with the chiplets 20 adhered thereto is brought adjacent to the common substrate 10 (FIG. 5C) and then brought into contact with an adhesive layer 29 on the common substrate 10 to apply 140 the chiplets 20 to the common substrate 10 (FIG. 5D).

In either case, when the process is complete the connection pads 24 on the bottom side 30B of the chiplets 20 are closer to the common substrate 10 than the top side 30A of the chiplets 20. Additional connection pads 24 can be formed on the opposite, top side 30A of the chiplets 20.

Figure 5E:
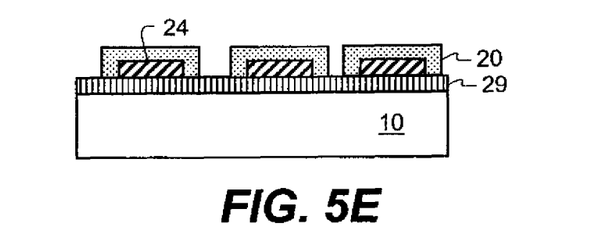
Figure 6:
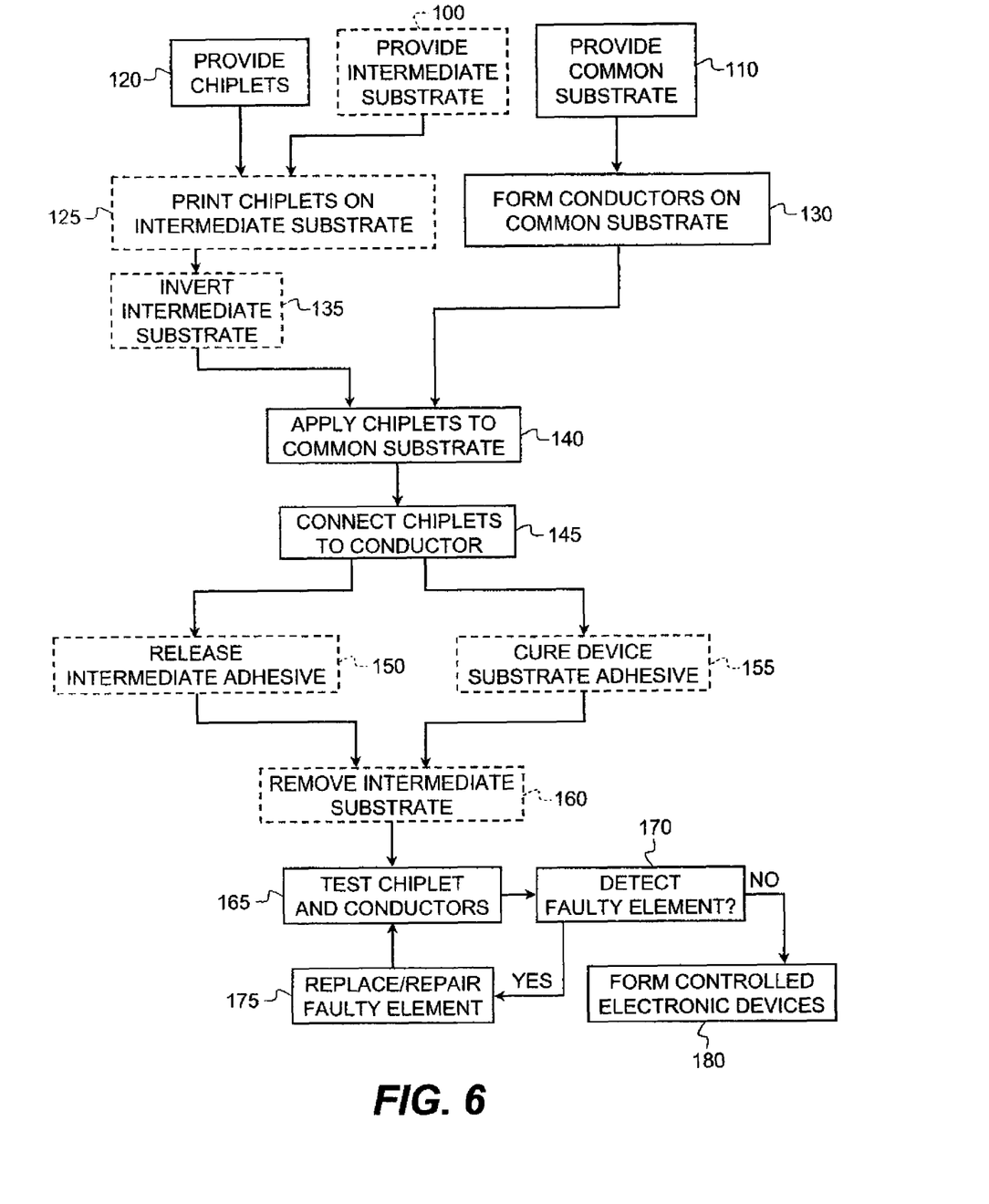
FIG. 6 is a flow graph illustrating a method of the present invention.

If present, the intermediate substrate 10 can then be removed 160 (FIG. 5E). An adhesive can be provided on an adhesive-receiving side of the common substrate 10. It is helpful if the adhesive layer 29 on the adhesive-receiving side of the common substrate 10 is stronger than the adhesive layer 28 on the adhesive-receiving side of the intermediate substrate 8 so that the chiplets 20 preferentially adhere to the common substrate 10. This can be accomplished, for example, by providing a releasable adhesive for adhesive layer 28 on the intermediate substrate 8 and releasing 150 the releasable adhesive to assist in removing 160 the intermediate substrate 8. In another embodiment of the method the present invention, the adhesive layer 29 on the common substrate 10 can be cured 155 (e.g. by light 50 as shown in FIG. 5D) to firmly and preferentially adhere the chiplets 20 to the common substrate 10. The connection pads of the chiplets are electrically connected 145 to conductors, for example through flowing solder, electrically-conducting polymers, or using thermal compression bonding with anisotropic conductive films.

When the chiplets are known to be operating successfully, the controlled electronic devices, for example pixels such as organic light-emitting diode pixels, can be formed over the common substrate to make a working electronic apparatus, such as a display device. By testing and repairing the chiplets before the controlled electronic devices are formed, costs can be reduced and manufacturing yields improved. Chiplets with connection pads and control circuitry can be constructed using photolithographic processes known in the art. When forming the connection pads on the top side of the chiplets, the photolithographic process is conventional. For example, chiplets can be fabricated with connection pads on the top surface that are approximately 45 um×20 um with 10 um between the pads. This is most amenable to a chiplet design with a single row of bond pads when using the currently practiced chiplet release technology from SOI (silicon-on-insulator) wafers. After releasing the substrates of the chiplets from the original wafer, the chips are suspended on tethers formed in the chiplet substrate silicon. Using a conventional PDMS stamp, the tethers can be broken and the chiplets picked up. Applicant has demonstrated this technology for stamps picking up hundreds of chiplets.

Chiplets can be printed onto a common substrate coated with an adhesive film. Common substrates can comprise, for example, glass, plastic, or metal. Suitable adhesive films can be UV-releasable, for example Nitto Denko UE 20914 which has an adhesion of 8.33 N/20 mm before UV exposure and 0.06 N/20 mm after UV exposure.

According to one embodiment of a method of the present invention, small bumps with height of approximately 10 um can be formed on the common substrate in the chiplet locations where the contacts to the chiplet connection pads are to be made. The bumps are approximately the same size and shape as the contact pads on the chiplet. The bumps can be formed by patterning photo resist, or ink-jet deposition of polymer. In one embodiment, the bumps can be made by patterning photo resist using photolithographic methods and suitable materials such as Dow Chemical Company Cylotene 4026-46 BCB resin. Conductors can be formed over the common substrate by any one of many conventional methods (sputter or evaporation of metal through shadow masks, or blanket deposition followed by photo resist patterning and etching, or by ink-jet deposition of silver nano-particles and sintering). In one method, sputter deposition of metal can be performed and subsequently patterned by conventional photolithography methods.

Anisotropic conductive films (ACF) can be applied to the areas on the common substrate where the electrical connections to the chiplet connection pads will be made. ACF products made by Sony Corp are suitable for this purpose. In particular product CP6920F2 has conductive particles that are 2.8 um in diameter and can be used with bond pads that are separated by only 7.5 um.

Chiplets can be transferred from the intermediate substrate to the common substrate by inverting the intermediate substrate with the adhered chiplets and aligning the intermediate substrate to the common substrate and pressing the two substrates together. For the CP6920F2 ACF material, the pre-bonding conditions are 1-2 sec at 60-80 C and a pressure of 0.3-1.0 MPa (on the chiplets). The final bonding conditions are 5 sec at 190 C and a pressure 60-80 MPa. These conditions are within the range of standard thermal compression bonding machines. After the bonds have been formed, the adhesive can be exposed with UV light through the intermediate substrate (if transparent) to release the chiplets from the inverting glass. For the Nitto Denko UE 2091-J adhesive film, use a UV irradiation of 460 mj/cm2. In a further embodiment of a method of the present invention, the chiplets 20, the conductors 18, and the electrical connections 26 can be tested 165 by providing test signals on the externally accessible conductors 18, for example from a controller (not shown). Such test signals can be digital or analog and can be chosen to operate the chiplet circuitry and to provide responses to the test signals that can detect 170 faults in the chiplets 20, the conductors 18, and the electrical connections 26. If faults are found, the chiplet 20 or conductors 18 can be replaced or repaired 175 and the system retested 165. If no faults are found, the controlled electronic devices can be formed 180, e.g. an OLED display device controlled by the chiplets.

Figure 3:
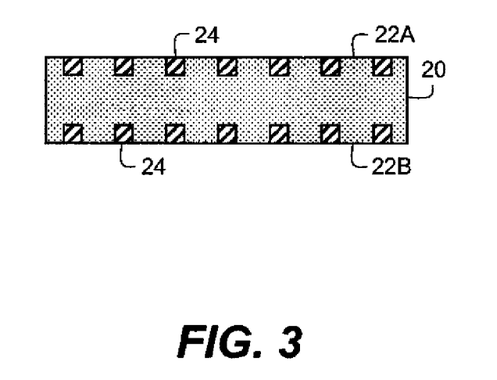
FIG. 3 is a cross-section of a chiplet according to another embodiment of the present invention.

Chiplet devices with connection pads on both the top and bottom surfaces (e.g. as shown in FIG. 3) can be constructed using available through silicon vias (TSV) technology. Such methods, for example are being used for CMOS image sensors. In one such technique, a via or hole is etched through the silicon (and often many overlying layers of metal and dielectric) using a deep reactive ion etching (DRIE) process. This hole is then typically lined with a dielectric "sleeve" deposited by CVD. A diffusion barrier and copper seed layer are then deposited by physical vapor deposition (PVD), and the hole is filled by electroplated copper. Wet etch processes have also been developed to create via holes, and laser drilling is also a viable alternative.

The present invention has the advantage that the chiplets 20, electrical connections 26, and conductors 18 can be tested before the chiplets 20, electrical connections 26, and conductors 18 are buried beneath a planarization layer (e.g. planarization layers 30A and 30B and are therefore accessible for repair. For example, a faulty chiplet could be removed from the substrate and a second chiplet applied in its place. Alternatively, a second chiplet could be applied over or adjacent to the faulty chiplet. A break in a conductor can be repaired, for example by using an inkjet-deposited curable, electro-conductive ink. A short can be opened by using lasers. Curable, electro-conductive inks are known in the art as are laser repair techniques.

Winters et al. in the above cited commonly-assigned, co-pending U.S. patent application Ser. No. 12/191,478, entitled "OLED DEVICE WITH EMBEDDED CHIP DRIVING," describes the use of a plurality of small, crystalline silicon pieces ("chiplets") in conjunction with a large glass substrate to provide active-matrix control in a display device. The chiplets contain driving elements such as transistors and are first formed on a semiconductor wafer. The small chiplet devices are then released from the silicon wafer substrate and mounted onto a glass display substrate. A series of planarization layers are employed to adhere and bury the chiplet.

The present invention can be employed in both a top-emitter configuration and a bottom-emitter configuration. In a bottom-emitter configuration, the bottom electrode 12 is transparent, for example composed of ITO, and the top electrode 16 can be reflective, for example composed of a metal such as aluminum, silver, or magnesium, or metal alloys. In a bottom emitter configuration, the substrate 10 must also be transparent but there is no such restriction in a top-emitter configuration. In a top-emitter configuration, the bottom electrode 12 can be reflective although the top electrode 16 must be transparent. FIG. 1 illustrates an embodiment of the present invention that can be either top emitting or bottom emitting.

An adhesive layer 29 can be formed over at least a portion of the common substrate 10 and can be employed to adhere the chiplets 20 to the common substrate 10. One or more busses 18 can be formed over the common substrate 10 and can be employed to conduct power, ground, or control signals to a connection pad 24 on the chiplet 20. A planarization and insulating layer 30A can insulate the conductive busses 18 from the light-emitting layer 14. A chiplet-insulating layer 30B likewise can insulate and protect the chiplet 20.

In either a top-emitter or a bottom-emitter configuration, an optional color filter (not shown) can be employed to filter the light emitted by the light-emitting layer 14. A color filter can be formed between at least a portion of the common substrate 10 and the first electrode 12. The color filter can be formed directly on a portion of the common substrate 10 or on portions of other layers (not shown) formed over the common substrate 10. In a top-emitter embodiment, a color filter can be located on a cover (not shown) or directly on the second electrode 16. In a display device, multiple color filters can be employed with multiple chiplets and multiple, independently controlled, bottom electrodes to make multiple pixel elements having differently colored sub-pixels. The color filters are especially useful in the case in which the light-emitting materials are not patterned over the substrate. Alternatively, different light-emitting materials may be patterned over the substrate in correspondence with the bottom electrode, each light-emitting material emitting a different color of light, to form a multi-colored display.

According to the present invention, any layer coated generally over the common substrate 10 but not over or above the chiplet 20 or the first electrode 12 can form the substrate surface. Any layer patterned only between the chiplet 20 and substrate surface (e.g. the adhesive layer 29) can be considered part of the chiplet 20 so that the chiplet 20 is adhered to the substrate surface, even in the presence of such a patterned layer. Likewise, any layer patterned only between the first electrode 12 and the substrate surface (e.g. a color filter) is considered part of either the first electrode 12 or the substrate surface so that the first electrode 12 is formed on the substrate surface, even in the presence of such a patterned layer. Alternatively, a layer coated over a portion of the substrate 10 but not extending over or above the chiplet 20 or the first electrode 12 and comprising different materials or deposited in a different step can be considered to form a part of the substrate surface.

Today a large-volume manufacturing infrastructure exists to make and sell "color-filter glass" for the LCD industry. These products include patterned color filters on glass, covered with a patterned transparent conductor—usually ITO. A low-cost embodiment of the current invention starts with this color-filter glass as the substrate and first electrode 12 for the emissive device.

In various embodiments of the present invention, the first electrode can be formed in a common step with the electrical conductor, thereby reducing manufacturing costs. One or more busses can be formed over the common substrate and the busses formed in a common step with the first electrode 12. A buss-insulating and planarization layer 30A can be formed between the one or more conductive busses 18 and the first electrode 12. A chiplet-insulating and planarization layer 30B can be formed over the chiplet 20 and connection pads 24 and beneath the one or more light-emitting layers 14 or the second electrode 16. The buss-insulating and planarization layer 30A can be formed in a common step with the chiplet-insulating and planarization layer 30B. By forming elements of the present invention in common steps, processing steps and costs are reduced. Likewise the electrode connector 82 formed between the connection pad 24 on the chiplet 20 and the first electrode 12 can be formed either before the first electrode 12, after the first electrode 12, or most desirably, in the same step as the first electrode 12 in order to reduce processing steps and costs.

The common substrate 10 can comprise glass. The buss 18, top or bottom electrode 16, 12, or conductor 18 can be made of evaporated or sputtered metal, e.g. aluminum or silver, or metal alloy. The chiplet 20 can be formed using conventional techniques well established in the integrated circuit industry and located over the substrate 10 using methods described in co-pending, commonly assigned, U.S. application Ser. No. 12/191,478, referenced above. The insulation and planarization layers 30A, 30B can be made of resin. Commercially available materials (e.g. benzocyclobutene) can be employed to effectively adhere the chiplets 20 to the common substrate 10 and form the various insulating and planarization layers 30A, 30B.

Chiplets are separately manufactured from the display substrate 10 and then applied to the display substrate 10. The chiplets are preferably manufactured using silicon or silicon on insulator (SOI) wafers using known processes for fabricating semiconductor devices. Each chiplet is then separated from the wafer on which it is constructed prior to attachment to the display substrate. The crystalline base of each chiplet can therefore be considered a substrate separate from the common substrate and over which the chiplet's circuitry is disposed. In particular, the independent substrate is separate from the common substrate 10 on which the pixels are formed and the areas of the independent, chiplet substrates for a multi-chiplet device, taken together, are smaller than the common substrate 10. Chiplets can have a crystalline substrate to provide higher performance active components than are found in, for example, thin-film amorphous or polycrystalline silicon devices. Chiplets can have a thickness preferably of 100 µm or less, and more preferably 20 um or less. This facilitates formation of the transition layer 30 over a portion of the chiplet.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as the two transistors for each pixel, can be made small. The chiplet, however, also requires connection pads for making electrical connection to the wiring layer provided over the chiplets once assembled onto the display substrate. The connection pads must be sized based on the feature size of the lithography tools used on the display substrate (for example 5 µm) and the alignment of the chiplets to the wiring layer (for example +/−5 µm). Therefore, the connection pads can be, for example, 15 µm wide with 5 µm spaces between the pads. This means that the pads will generally be significantly larger than the transistor circuitry formed in the chiplet.

The connection pads 24 can generally be formed in a metallization layer on the chiplet 20 over the transistors. It is desirable to make the chiplet with as small a surface area as possible to enable a low manufacturing cost. Therefore, the size and number of the connection pads and not the transistors can limit the size of the chiplet.

The present invention can be employed in devices having a multi-pixel or multi-chiplet infrastructure and can be employed in either an active-matrix configuration in which the chiplet has circuitry that controls each pixel as an active-matrix element or as a passive-matrix controller. The present invention provides advantages when decreased costs and improved performance are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top-emitter architecture or bottom-emitter architecture.

The invention has been described in detail with particular reference to certain preferred embodiments thereof, but it should be understood that variations and modifications could be effected within the spirit and scope of the invention.

PARTS LIST 8 intermediate substrate
10 common substrate
11 working or display area
12 first/bottom electrode
14 light-emitting layer
16 second/top electrode
18 conductor, electrical buss
20 chiplet
21 chiplet location
22A top side
22B bottom side
24 connection pad
26 electrical connection
28 adhesive layer on intermediate substrate
29 adhesive layer on common substrate
30 transition layer
30A, 30B planarization insulating layer
31A common substrate planarization structure
31B chiplet substrate planarization structure
32 metal wiring layer
48 chiplet substrate
50 light
80 controlled electro-optic device, pixel
82 electrode connector
100 provide intermediate substrate step
110 provide common substrate step
120 provide chiplets step
125 print chiplets on inverting substrate step
130 form conductors on common substrate step
135 invert intermediate substrate step
140 apply chiplets to common substrate step
145 connect chiplet to conductor step
150 release inverting adhesive step
155 cure device adhesive step
160 remove intermediate substrate step
165 test chiplet and conductors step
170 detect faulty element step
175 replace or repair faulty element step
180 form controlled electronic devices

The invention claimed is:

1. An electronic apparatus, comprising:
a common substrate comprising an optical working area including a plurality of chiplet locations;
a plurality of controlled electro-optic devices disposed over the common substrate in the working area, each electro-optic device adapted to emit or absorb light;
a wiring layer comprising a plurality of conductors formed on the common substrate;
a plurality of chiplets located over the common substrate in the chiplet locations, each chiplet comprising an independent substrate separate from the common substrate, each independent substrate comprising a bottom side opposing a top side with one or more connection pads formed on the bottom side of the chiplet, each chiplet comprising circuitry for controlling functions of one or more of the controlled electro-optic devices; and
connection pads formed on the top side of one or more chiplets,
wherein the chiplets are adhered to the common substrate with the bottom side of the chiplet closer to the common substrate than the top side of the chiplet, and
wherein each connection pad on the bottom side of the chiplet is electrically connected to one of the plurality of conductors.

2. An electronic apparatus, comprising:
a common substrate comprising an optical working area including a plurality of chiplet locations;
a plurality of controlled electro-optic devices disposed over the common substrate in the working area, each electro-optic device adapted to emit or absorb light;
a wiring layer comprising a plurality of conductors formed on the common substrate;
a plurality of chiplets located over the common substrate in the chiplet locations, each chiplet comprising an independent substrate separate from the common substrate, each independent substrate comprising a bottom side opposing a top side with one or more connection pads formed on the bottom side of the chiplet, each chiplet comprising circuitry for controlling functions of one or more of the controlled electro-optic devices,
wherein the chiplets are adhered to the common substrate with the bottom side of the chiplet closer to the common substrate than the top side of the chiplet,
wherein each connection pad is electrically connected to one of the plurality of conductors,
wherein the bottom side of a chiplet comprises non-planar protruding structures, and
wherein the device further comprises complementary structures located on the common substrate comprising a shape complementary to the chiplet shape in the desired chiplet locations, the complementary structures configured to receive the non-planar protruding structures and physically align the chiplet to the common substrate.

3. The device of claim 1, wherein the electrical connection between the connection pads and the conductors comprises an anisotropic conductive film or a thermal compression bond.

4. The device of claim 1, wherein the controlled electronic devices comprise pixels in a display, sensors in an image sensor, or current generating circuits in a photovoltaic cell.

5. An electroluminescent display device, comprising:
a common substrate comprising a display area including a plurality of chiplet locations;
a plurality of pixels disposed over the common substrate in the display area, each pixel comprising:
a first electrode formed over the common substrate, one or more layers of light emitting material; and
a second electrode formed over the one or more layers of light-emitting material;
a metal wiring layer comprising a plurality of conductors formed on the common substrate;
a plurality of chiplets located over the common substrate in the chiplet locations, each chiplet comprising an independent substrate separate from the common substrate, each independent substrate comprising a bottom side opposing a top side with one or more connection pads formed on the bottom side of the chiplet, each chiplet comprising circuitry for controlling at least one pixel; and
connection pads formed on the top side of one or more chiplets,
wherein the chiplets are adhered to the common substrate with the bottom side of the chiplet closer to the common substrate than the top side of the chiplet,
wherein each connection pad on the bottom side of the chiplet is electrically connected to one of the plurality of conductors, and
wherein at least one connection pad is connected to each of the first or second electrodes.

6. The device of claim 2, wherein the protruding structures are outside the electrical path of the conductors.

* * * * *